(12) United States Patent
Trocke et al.

(10) Patent No.: US 7,382,182 B2
(45) Date of Patent: Jun. 3, 2008

(54) SYSTEM FOR REDUCING CALIBRATION TIME OF A POWER AMPLIFIER

(75) Inventors: Robert S. Trocke, Caledonia, WI (US); Armin W. Klomsdorf, Libertyville, IL (US)

(73) Assignee: Motorola, Inc., Schaumburg, IL (US)

( * ) Notice: Subject to any disclaimer, the term of this patent is extended or adjusted under 35 U.S.C. 154(b) by 207 days.

(21) Appl. No.: 11/170,208

(22) Filed: Jun. 29, 2005

(65) Prior Publication Data

US 2007/0001756 A1    Jan. 4, 2007

(51) Int. Cl.
*G01R 19/00* (2006.01)
(52) U.S. Cl. ............................ 330/2; 330/307; 330/302
(58) Field of Classification Search .................... 330/2, 330/307, 302
See application file for complete search history.

(56) References Cited

U.S. PATENT DOCUMENTS

| | | | |
|---|---|---|---|
| 6,255,908 B1 | 7/2001 | Ghannouchi et al. | |
| 6,366,177 B1 | 4/2002 | McCune et al. | |
| 6,798,843 B1 | 9/2004 | Wright et al. | |
| 6,809,678 B2 * | 10/2004 | Vera et al. | 341/166 |
| 7,038,544 B2 * | 5/2006 | Diorio et al. | 330/279 |
| 7,082,290 B2 * | 7/2006 | Takano et al. | 455/102 |
| 7,183,844 B2 * | 2/2007 | Klomsdorf et al. | 330/129 |
| 2004/0061555 A1 | 4/2004 | Lynch | |
| 2005/0032515 A1 | 2/2005 | Mastio | |
| 2005/0118965 A1 | 6/2005 | Tanabe et al. | |

OTHER PUBLICATIONS

"A fully-Integrated Single-chip SOC for Bluetooth", ISSCC 2001/ SESSION 13/Wireless LAN/13-1, 3 pages.

* cited by examiner

*Primary Examiner*—Patricia Nguyen
(74) *Attorney, Agent, or Firm*—Hisashi D. Watanabe (57) ABSTRACT

A system for reducing the calibration time of a Power Amplifier (PA) (202) is provided. The system includes a memory module (304) that is integrated in the PA. The memory module is configured to store one or more calibration parameters of the PA.

11 Claims, 6 Drawing Sheets

SYSTEM FOR REDUCING CALIBRATION TIME OF A POWER AMPLIFIER

FIELD OF THE INVENTION

The present invention relates generally to the field of RF architecture. In particular, the present invention relates to an RF architecture with an integrated memory module.

BACKGROUND OF THE INVENTION

Electronic devices employ RF architectures for communication. RF architectures comprise a Power Amplifier (PA) that can be used to amplify the signal during communication. The operation of a PA is a major contributor to current drain in a battery and heat dissipation, which occur in electronic devices. High battery drain results in reduced talk time and battery life. To increase the life of a battery, its size could be increased, in order to store more electrical power. This, in turn, would affect the overall size and weight of the handset and the comfort involved in using the electronic device.

Different techniques are conventionally employed to minimize the drain of the PA, which enhance the efficiency of the electronic device. These techniques add complexity to the electronic device. They also result in increased factory testing time and the calibration time of electronic devices. The characteristics of the PA are compensated for operating the electronic device. This is especially true in the case of electronic devices that operate on spread spectrum and polar modulation. Compensation entails the availability of detailed calibration parameters for different components in the electronic device, such as the PA. The calibration parameters are obtained by extensive testing of the components; and they are stored in calibration tables. The PA manufacturer often measures these calibration parameters. However, they are re-measured during the manufacturing of the electronic devices, since the calibration parameters are not available to the manufacturer of the electronic device. Therefore, re-measurement of the calibration parameters results in an increase in the time taken to manufacture the electronic devices.

The preparation of calibration tables enables the PA and other components in an electronic device to meet operational specifications, but results in a very long testing period. This long testing time requires a full test period for second sourcing the PA, which results in inflexibility and difficulty in choosing a different vendor to source the PA. The large variation between each vendor's designs makes it difficult to second source a PA of a given RF architecture design.

Accordingly, there is a need for a mechanism that allows a PA to store calibration parameters within the PA.

BRIEF DESCRIPTION OF THE DRAWINGS

FIG. 7 is a flow diagram illustrating

DETAILED DESCRIPTION OF THE PREFERRED EMBODIMENTS

The present invention enables a reduction in the calibration time of a power amplifier (PA). Integrating a memory module with the PA, to store different calibration parameters of the PA, reduces the calibration time. The calibration parameters may include device identification and behaviour information, and may then be accessed at the time of testing the PA during the manufacturing process, reducing the test time required to integrate it in the electronic device.

One aspect of the present invention is a system for reducing the calibration time of a PA. The system comprises a memory module that is integrated with the PA in a PA module. The memory module can store one or more calibration parameters of the PA module. The calibration parameters are required to enable an open-loop polar modulation correction system. Using the open-loop modulation correction system is preferable to using a full-closed-loop correction system, since the full-closed-loop correction system is complex to implement and also expensive. Large, detailed tables describing PA calibration parameter measurements are required for the open loop modulation correction system. The storage of the calibration parameters of the PA module in the memory module eliminates the necessity of re-measuring the calibration parameters of the PA when the electronic device is being manufactured.

Another aspect of the invention is a system for determining the behaviour of a PA. The system includes a control circuit for controlling the operation of the PA, and a memory module. The memory module is integrated in the PA, to store the calibration parameters and performance specifications of the PA. The control circuit determines the behavior of the PA, using the stored calibration parameters and performance specifications.

Still another aspect of the invention is a method for producing a power amplifier that minimizes calibration time. A memory module is integrated in the power amplifier. One or more calibration parameters are then stored in the memory module.

Yet another aspect of the invention is a method of a calibration system for calibrating a power amplifier of an electronic device. In particular, one or more calibration parameters are copied from a memory module integrated in the power amplifier to a system memory of the calibration system.

Figure 1:
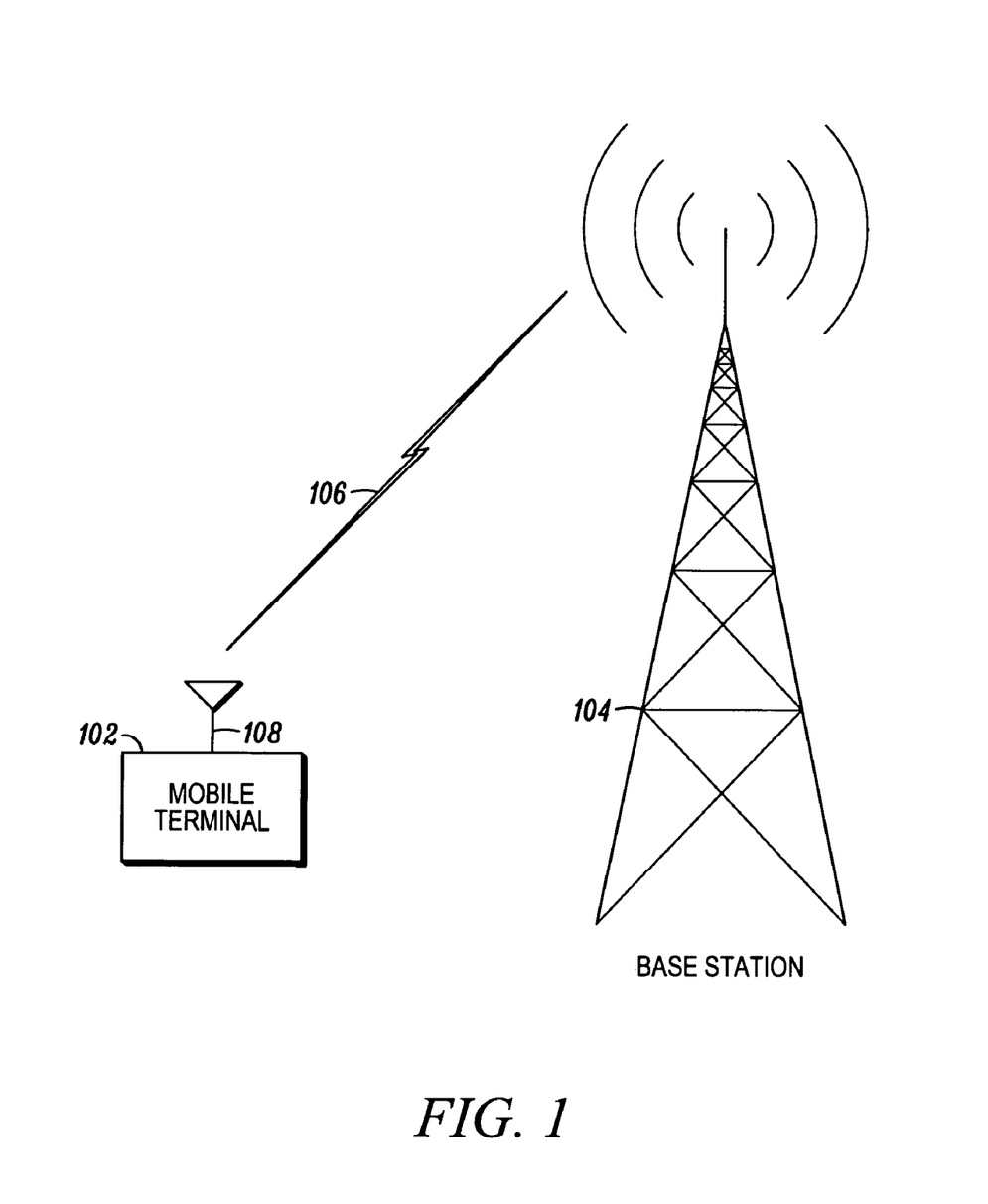
FIG. 1 is a representative environment of a mobile terminal, in accordance with the present invention.

Referring to FIG. 1, there is shown a representative environment 100 of a mobile terminal 102, in accordance with the present invention. The mobile terminal 102 operates in conjunction with an RF infrastructure. The RF infrastructure includes a base station 104. The mobile terminal 102 communicates with the base station 104 via transmission signal 106 through an antenna 108.

Figure 2:
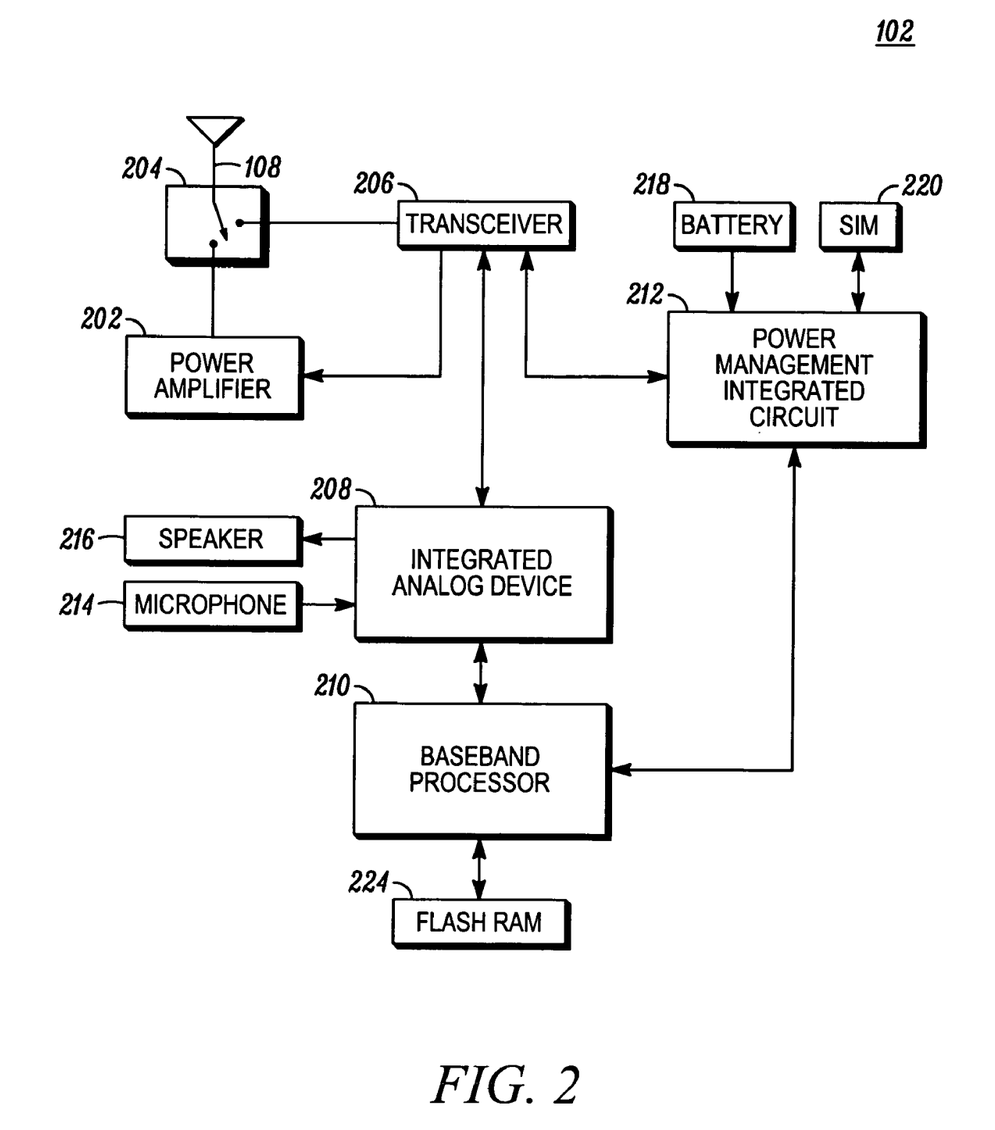
FIG. 2 is a block diagram illustrating exemplary components of the mobile terminal, in accordance with the present invention.

Referring to FIG. 2, there is shown a block diagram illustrating exemplary components of the mobile terminal 102, in accordance with the present invention. The mobile terminal 102 comprises a PA 202 that amplifies the transmission signal 106. A transmit/receive switch 204 is used to make a selection between transmitting the transmission signal 106 from the mobile terminal 102 and receiving the transmission signal 106 from the base station 104. An integrated analog device 208 receives a signal, which is transmitted as the transmission signal 106 from a baseband processor 210. The mobile terminal 102 further comprises a flash RAM 224 that is used by the baseband processor 210 to store operational data. The integrated analog device 208 receives analog audio signals from a microphone 214 and digitizes them. The integrated analog device 208 transmits the digitized signals to the baseband processor 210, which processes them. Further, the baseband processor 210 provides the processing and other functionalities required for the functioning of the mobile terminal 102. These functionalities include the provision of a carrier signal to modulate the signal that is to be transmitted, as well as to demodulate the transmission signal 106. A transceiver 206 transmits and receives the transmission signal 106 via the antenna 108. The integrated analog device 208 converts digital signals received from the transceiver 206 to analog signals and transmit them to a speaker 216. Further, the integrated analog device 208 converts the analog signals received from the microphone 214 to digital signals.

A power management integrated circuit 212 controls the operation of a battery 218 in the mobile terminal 102. A SIM 220 operates in conjunction with the power management integrated circuit 212, to provide the mobile terminal 102 with information within the SIM 220. The SIM 220 may comprise subscriber and service information, may be in the form of a Removable User Identity Module (R-UIM), or use any other user identification module.

Figure 3:
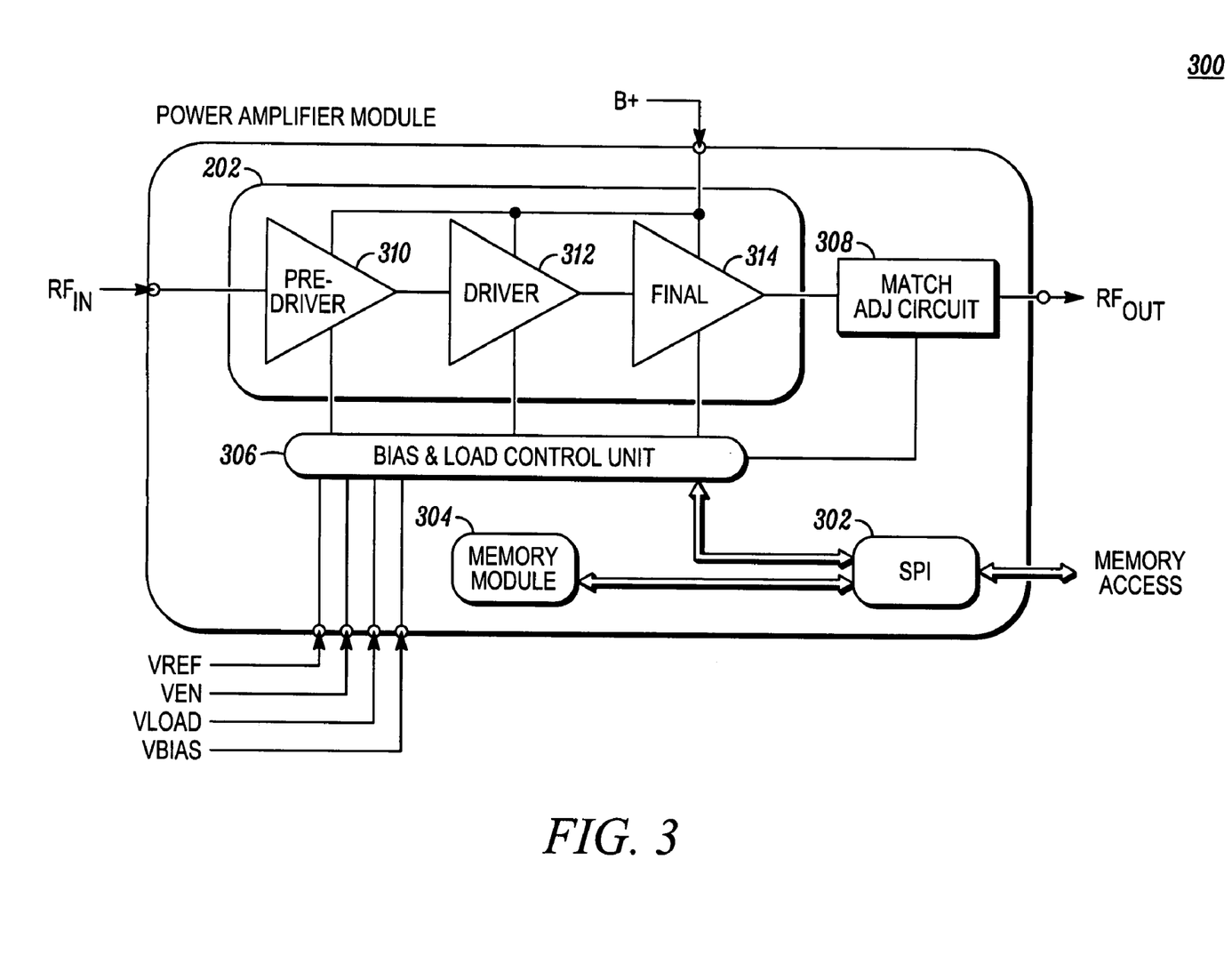
FIG. 3 is a block diagram illustrating an exemplary PA module, in accordance with the present invention.

Referring to FIG. 3 there is shown a block diagram illustrating an exemplary PA module 300, in accordance with the present invention. The PA module 300 comprises the PA 202, a serial peripheral interface (SPI) 302, a memory module 304, a bias and load control unit 306, and an output match adjustment circuit 308. The PA 202 comprises a pre-driver 310, a driver 312, and a final stage 314. The pre-driver 310 provides conditioning for the signal that is an input to the PA 202. The output of the pre-driver 310 is given to the driver 312, which drives the final stage 314. The final stage 314 amplifies the signal to achieve the required power amplification. The PA module 300 has a communication interface such as a 2 wire SPI, which provides access to the memory module 304 to store and retrieve calibration parameters from a group comprising factory measurements, calibration coefficients, Amplitude Modulation (AM) to Amplitude Modulation characteristics, Amplitude Modulation to Phase Modulation (PM) characteristics, and device information and identification. The calibration parameters are required to enable an open-loop polar modulation correction system. Using this system is preferable to employing a full closed-loop modulation correction system, which is costly and is difficult to implement. Large, detailed calibration tables, describing calibration parameter measurements for the PA 202, are required for the open-loop modulation correction system.

The PA module 300 further has a memory module 304 that is integrated with the PA 202. The SPI 302 may be utilized to provide access to the memory module 304. The memory module 304 may be used to store calibration coefficients such as device information and device identification, as well as the factory measurements of the PA module 300.

For one embodiment, the device information can be stored by a manufacturer of the PA module 300 in the memory module 304 when the PA module 300 is being manufactured. The device information can be retrieved at the time of production of the mobile terminal 102 or other electronic devices. The device information can be used to program the mobile terminal 102 and calibrate the PA module 300. For one embodiment, the mobile terminal 102 operates according to instructions received from a mobile terminal software. The mobile terminal software may retrieve the information stored in the PA module 300 when the mobile terminal 102 is switched on. The retrieval of the information stored in the PA module 300 can enable the mobile terminal software to control the radio power of the mobile terminal 102. Information stored in the PA module 300 may also enable real-time correction and control of the operating characteristics of the PA module 300. Real-time correction and control of the operating characteristics of the PA module 300 enables the correction and control of the operating characteristics of the mobile terminal 102. To enable correction and control of the operating characteristics of the mobile terminal 102, a determination of the behavior of the PA module 300 is required. For one embodiment, the behavior of the PA module 300 is determined and carried out by including sensing elements along with a bias and load control unit 306 and the memory module 304. The sensing element can sense one or more parameters, such as the temperature and power level of the PA module 300. The bias and load control unit 306 receives signals such as VREF, VEN, VLOAD and VBIAS for controlling bias of, and load on the PA 202. The output of the PA 202 is applied to an output match adjustment circuit 308. The output match adjustment circuit 308 matches the impedances of the PA 202 and the external circuitry of the mobile terminal 102.

Figure 4:
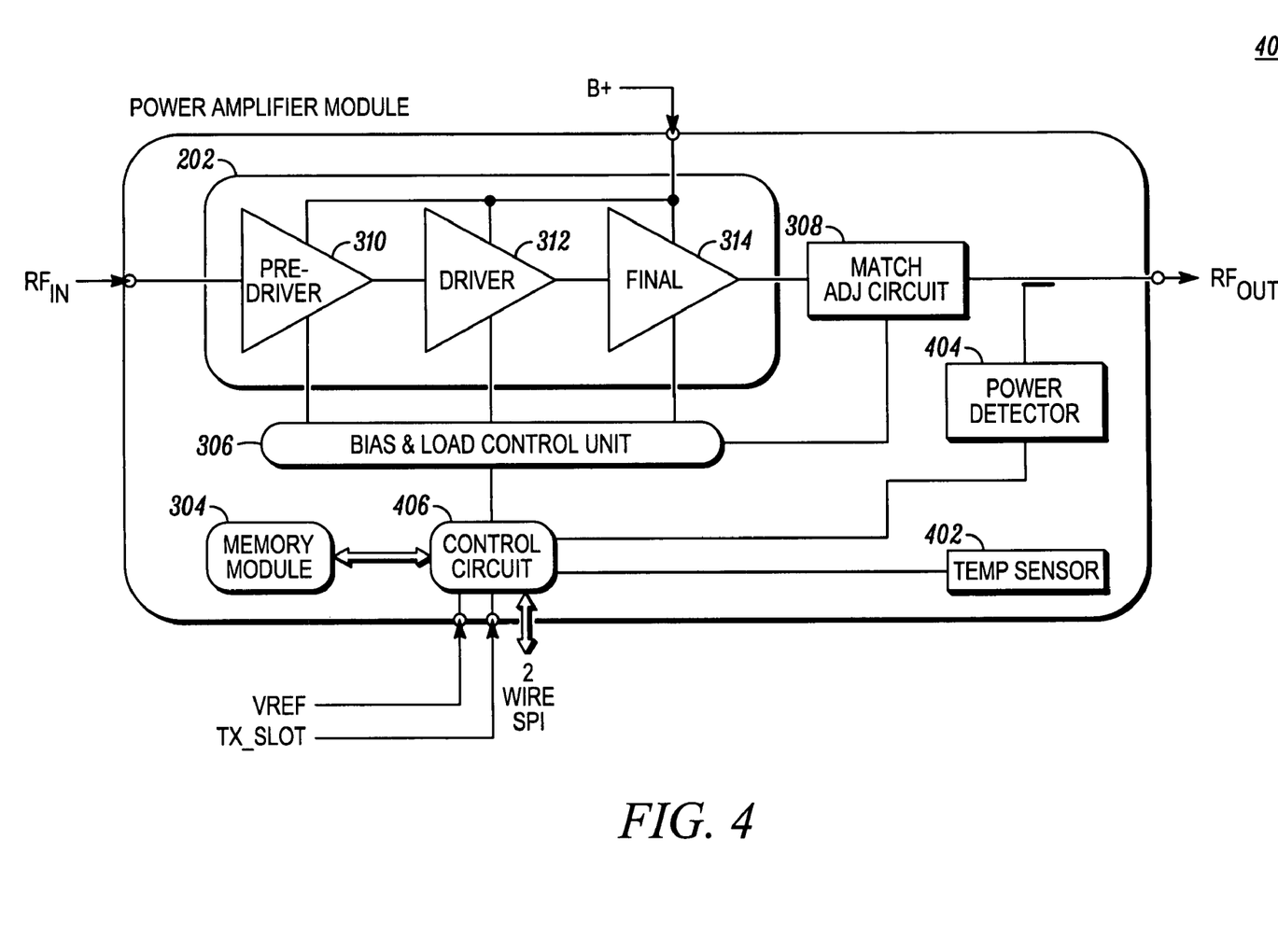
FIG. 4 is a block diagram illustrating an exemplary PA module with integrated memory and control circuitry, in accordance with the present invention.

Referring to FIG. 4 there is shown a block diagram illustrating an exemplary PA module 400 with an integrated memory and control circuitry, in accordance with the present invention. For one embodiment, the interaction of the components within the PA module 400 enables better control of the mobile terminal 102. This embodiment may be used to control the internal variable bias voltage and load states of the PA module 400 by the inclusion of a temperature sensor 402 and a power detector 404 with a communication interface such as the 2 wire SPI, to access the memory module 304. The temperature sensor 402 enables a control circuit 406 to vary the calibration of the PA 202, based on the temperature of the PA 202. The power detector 404 determines the output power of the PA 202.

For one embodiment, an RF switch is included in the PA module 400, enabling supply voltage control by selectively switching on stages of the PA 202, thereby controlling the operation of the control circuit.

For another embodiment, a switching regulator is provided at the B+ supply input point of the PA 202 in the PA module 400. The switching regulator enables supply voltage control of the PA 202.

For another embodiment, there is a power detector 404 connected to the input point of the PA 202. The power detector 404 may enable the control circuit 406, coupled with the power detector 404 at the output point of the PA 202, to determine the gain of the PA 202. The mobile terminal software can communicate a transmit mode and the output power of the PA 202 to the control circuit 406. The communication of the transmit mode and the output power of the PA 202 to the control circuit 406 may enable the control circuit 406 to determine a bias that is to be applied to each amplifier stage.

The communication of the transmit mode and the output power of the PA 202 to the control circuit 406 may further enable the control circuit 406 to determine an output match adjustment for the PA 202, by referring to the calibration parameters stored in the memory module 304. The determination of the bias and output match adjustment enables the control circuit 406 to communicate an expected RF gain variation to the mobile terminal software. The mobile terminal software utilizes the value of the expected RF gain variation, to control the power output of the PA module 400, which can be controlled at uplink slot transition boundaries. The power output of the PA module 400 is controlled by signals, such as RFin and TX_SLOT. Controlling the power allows the uninterrupted operation of the PA module 400, even when changes are made to its operating characteristics.

Figure 5:
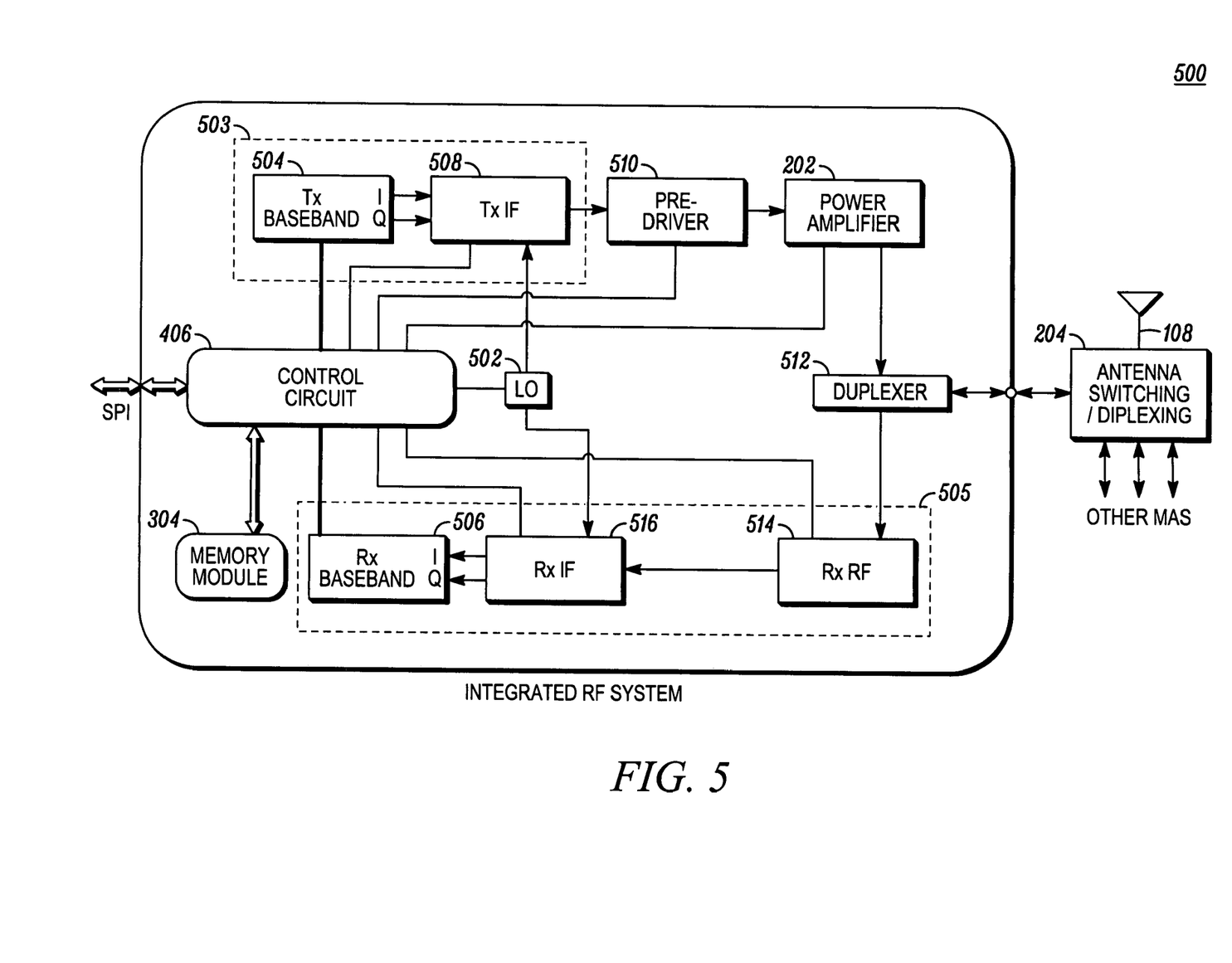
FIG. 5 is a block diagram illustrating an exemplary integrated RF system with integrated modules, in accordance with the present invention.

Referring to FIG. 5 there is shown a block diagram illustrating an exemplary integrated RF system 500 with integrated modules, in accordance with the present invention. The integrated RF system 500 includes a communication interface such as an SPI and the memory module 304, which can store the calibration parameters and other information pertaining to the functional blocks of the integrated RF system 500. The calibration parameters may be utilized to reduce the time required for testing the functional blocks present in the integrated RF system 500. The storage of the calibration parameters of the functional blocks of the integrated RF system 500 in the memory module 304 reduces the time required for testing other different functional blocks at the time of manufacture.

For one embodiment, the integrated RF system 500 comprises the memory module 304, the control circuit 406, and a local oscillator (LO) circuit 502, which provides the transmit block 503 with a transmit LO signal and provides the receive block 505 with a receive LO signal. A transmit module 503 comprises a transmit baseband block 504 and a receive baseband block 506. The transmit baseband block 504 feeds the signal to be transmitted to a transmit intermediate frequency block 508, which outputs a signal that is given as an input to a pre-driver 510 for conditioning before its amplification by the PA 202. The output of the PA 202 is fed into a duplexer 512, which duplexes the signals that are input to the integrated RF system 500 and the output signals from the integrated RF system 500. The duplexer outputs a signal to the transmit/receive switch 204, for transmission from the antenna 108.

Further, a signal received by the antenna 108 is given as an input to the duplexer 512 through the transmit/receive switch 204. The duplexer 512 transmits the received signal to a receive module 505. The receive module 505 comprises a receive baseband block 506, a receive intermediate frequency (IF) block 516, and a receive RF block 514. The output of the duplexer 512 is given as an input to the receive RF block 514. The receive RF block 514 outputs the received RF signal to the receive IF block 516. The receive IF block 516 outputs an IF signal, which is then given as an input to the receive baseband block 506.

Figure 6:
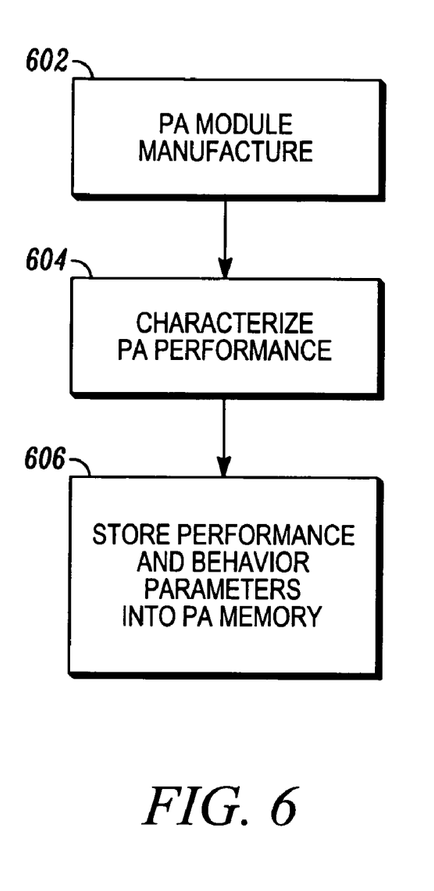
FIG. 6 is a flow diagram illustrating production of a power amplifier that minimizes calibration time.

Referring to FIG. 6, there is shown a method for producing a power amplifier that minimizes calibration time. For one embodiment, a producer or manufacturer of power amplifiers may integrate a memory module in a power amplifier for storing one or more calibration parameters, such as performance and behavior parameters, of the power amplifier. As shown in FIG. 6, the producer may manufacture the power amplifier at step 602. While producing the power amplifier, the producer may integrate a memory module in the power amplifier. After manufacturing the power amplifier, the producer may analyze the power amplifier to determine the performance of the power amplifier and characterize the calibration parameter or parameters of the power amplifier at step 604. Thereafter, the producer may store the calibration parameter or parameters in the integrated memory module of the power amplifier.

The producer may analyze the power amplifier in many ways when attempting to characterize the calibration parameter or parameters. For one embodiment, the producer may determine the power amplifier linearity with respect to a bias voltage. For another embodiment, the producer may determine an amplitude modulation-to-amplitude modulation coefficient and/or amplitude modulation-to-phase modulation coefficients necessary for polar modulation. For yet another embodiment, the producer may determine a lookup table or a series of lookup tables that describe how the power amplifier may be configured for a particular signal configuration.

Figure 7:
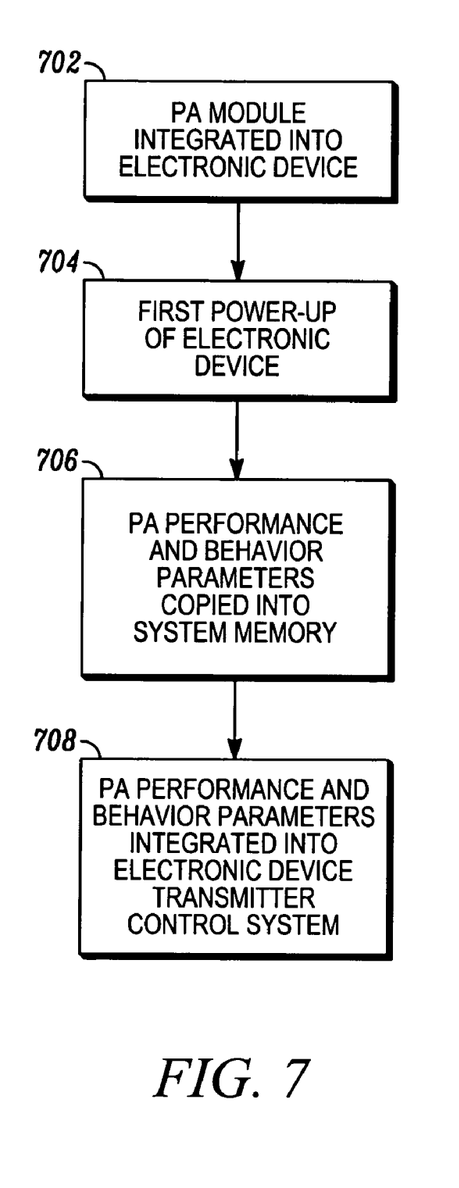

Referring to FIG. 7, there is shown a method of a calibration system for calibrating a power amplifier of an electronic device. The power amplifier may be calibrated by the manufacturer or user of the power amplifier, but it is likely that the power amplifier will be calibrated by an assembler of an electronic device that utilizes the power amplifier or re-calibrated by a technician who services the electronic device. The power amplifier is assembled in the electronic device at step 702 and, then, the electronic device is power-up at step 704. Next, in response to detecting the power-up of the electronic device, one or more calibration parameters of the power amplifier are copied from a memory module integrated in the power amplifier to a system memory of the calibration system at step 706. Thereafter, the calibration parameter or parameters are transferred from the system memory of the calibration system to a transmitter control system of the electronic device at step 708.

While the preferred embodiments of the invention have been illustrated and described, it is to be understood that the invention is not so limited. Numerous modifications, changes, variations, substitutions and equivalents will occur to those skilled in the art without departing from the spirit and scope of the present invention as defined by the appended claims.

What is claimed is:

1. A system for reducing calibration time of a Power Amplifier (PA), the system comprising:
    a control circuit, the control circuit controlling the operation of the PA;
    a memory module integrated in the PA for storing calibration parameters and performance specifications of the PA, wherein the calibration parameters and the performance specifications are used by the control circuit to determine the behavior of the PA;
    a bias and load control unit controlling at least one of a bias and a load on the PA;
    a communication interface providing access to the memory module;
    a temperature sensor providing temperature of the PA to the control circuit; and
    a power detector providing output power level of the PA to the control circuit.

2. The system as recited in claim 1, further comprising:
    a bias and load control unit controlling at least one of a bias and a load on the PA; and
    a communication interface providing access to the memory module.

3. The system as recited in claim 2, wherein the communication interface comprises a Serial Peripheral Interface (SPI), the SPI providing access to the memory module for storing and retrieving calibration parameters from a group consisting of factory measurements, calibration coefficients, Amplitude Modulation (AM) to Amplitude Modulation characteristics, Amplitude Modulation to Phase Modulation (PM) characteristics, device information and device identification.

4. The system as recited in claim 1, wherein the calibration parameters enable open-loop polar modulation.

5. A system for determining behaviour of a Power Amplifier (PA), the system comprising:
 a control circuit, the control circuit controlling the operation of the PA;
 a memory module integrated in the PA for storing calibration parameters and performance specifications of the PA, wherein the calibration parameters and the performance specifications are used by the control circuit to determine the behavior of the PA and
 a switching regulator at the input of the PA, the switching regulator enabling input voltage control of the PA.

6. A system for determining behavior of a Power Amplifier (PA), the system comprising:
 a control circuit, the control circuit controlling the operation of the PA;
 a memory module integrated in the PA for storing calibration parameters and performance specifications of the PA, wherein the calibration parameters and the performance specifications are used by the control circuit to determine the behavior of the PA; and
 a power detector at the input of the PA, the power detector enabling the control circuit to determine a gain of the PA by comparing input power and output power of the PA.

7. The system as recited in claim 5, further comprising a Radio Frequency (RF) switch, the RF switch selectively switching on stages of the PA and controlling operation of the control circuit.

8. A method for producing a power amplifier that minimizes calibration time, the method comprising:
 integrating a memory module in the power amplifier;
 storing one or more calibration parameters in the memory module controlling at least one of a bias and a load on the PA using a bias and load control unit;
 providing access to the memory module using a communication interface;
 providing temperature of the PA to the control circuit using a temperature sensor; and
 providing output power level of the PA to the control circuit using a power detector.

9. The method of claim 8, further comprising characterizing the one or more calibration parameters.

10. The method of claim 9, wherein characterizing the one or more calibration parameters includes at least one of determining the power amplifier linearity with respect to a bias voltage, determining an amplitude modulation-to-amplitude modulation coefficient and amplitude modulation-to-phase modulation coefficients necessary for polar modulation, and determining at least one lookup table including a power amplifier configuration associated with a particular signal configuration.

11. A method for producing a power amplifier that minimizes calibration time, the method comprising:
 integrating a memory module in the power amplifier;
 storing one or more calibration parameters in the memory module; and
 enabling input voltage control of the PA using a switching regulator at the input of the PA.

* * * * *